United States Patent [19]

Yamanoi et al.

[11] 4,126,839
[45] Nov. 21, 1978

[54] SURFACE ACOUSTIC WAVE APPARATUS

[75] Inventors: Hiroshi Yamanoi, Hiratsuka; Tomosaburo Kitamura, Kawasaki, both of Japan

[73] Assignee: Sony Corporation, Tokyo, Japan

[21] Appl. No.: 768,781

[22] Filed: Feb. 15, 1977

[30] Foreign Application Priority Data

Feb. 26, 1976 [JP] Japan ................................ 51-20348

[51] Int. Cl.² .................... H03H 9/26; H03H 9/04; H03H 9/30; H01L 41/10
[52] U.S. Cl. .................................... 333/72; 333/30 R
[58] Field of Search ............... 333/30 R, 72; 310/313; 331/107 A; 330/5.5, 4.6; 350/96 WG, 161 S

[56] References Cited

U.S. PATENT DOCUMENTS

| | | | |
|---|---|---|---|
| 3,688,223 | 8/1972 | Pratt et al. | 333/72 |
| 3,916,347 | 10/1975 | Bert et al. | 333/30 R X |
| 3,983,424 | 9/1976 | Parks | 333/30 R X |

Primary Examiner—Eugene La Roche
Assistant Examiner—Marvin Nussbaum
Attorney, Agent, or Firm—Hill, Gross, Simpson, Van Santen, Steadman, Chiara & Simpson

[57] ABSTRACT

A surface acoustic wave apparatus is disclosed in which a conductive earth pattern is formed on almost all the upper surface of a header, a surface acoustic wave element is provided on the header through the conductive earth pattern, and the conductive earth pattern is separated between an input side earth pin and an output side earth pin.

8 Claims, 12 Drawing Figures

SURFACE ACOUSTIC WAVE APPARATUS

BACKGROUND OF THE INVENTION

1. Field of the Invention

The present invention relates generally to a surface acoustic wave apparatus such as a surface acoustic filter utilizing a surface acoustic wave, and is directed more particularly to a surface acoustic wave apparatus in which a penetrating level is improved and hence the spurious level is improved.

2. Description of the Prior Art

In the art, a prior art surface acoustic wave apparatus such as a surface acoustic wave filter is formed of a header 1 and a surface acoustic wave element 2 mounted on the header 1, as shown in FIGS. 1 and 2. The surface acoustic wave element 2 is formed of a surface acoustic wave propagating medium such as a piezo-electric substrate $2_S$, an input electrode 3, which consists of a pair of comb-shaped electodes $3a$ and $3b$ and is mounted on the piezo-electric substrate $2_S$, and output electrode 4, which consists of a pair of comb-shaped electrodes $4_{a1}$, $4_{a2}$ and a comb-shaped electrode $4b$ opposed commonly to the former to convert the filtering pass band and is mounted on the piezo-electric substrate $2_S$, and an earth electrode 5 mounted on the substrate $2_S$ between the input and output electrodes 3 and 4.

The header 1 is formed of an insulating plate 6 which is made of, for example, epoxy resin and an earth pattern 7 which is made of an electric conductive layer and coated on almost all of one surface of the insulating plate 6. The surface acoustic wave elements 2 is mounted on the earth pattern 7. A terminal pin 8, which is electrically contacted with the earth pattern 7 and opposed to the earth electrode $3_b$ of the input electrode 3, a terminal pin 9, which is electrically contacted with the earth pattern 7 and opposed to the earth electrode $4_b$ of the output electrode 4, and a terminal pin 10, which is electrically contacted with the earth pattern 7 and opposed to the earth electrode 5, are planted on the header 1 therethrough, respectively. Parts of the earth pattern 7 on the header 1 at the locations opposing the respective electrodes $3_a$ and $4_{a1}$, $4_{a2}$ of the input and output electrodes 3 and 4 are removed, and conductive island patterns 11, 12 and 13 are coated on the header 1 at the locations of the removed parts of the earth pattern 7, respectively. Through the header 1 and the surface acoustic element 2, there are planted on the header 1, an input terminal pin 14 and output terminal pins 15, 16 which electrically contact with the patterns 11, 12 and 13, respectively. The comb-shaped electrodes $3a$ and $3b$ of the input electrode 3 are connected to the terminal pin 14 and 8 through lead wires 17 and 18, respectively, the earth electrode 5 is connected to the terminal pin 10 through a lead wire 19, and the comb-shaped electrodes $4_{a1}$, $4_{a2}$ and $4_b$ of the output electrode 4 are connected to the terminal pins 15, 16 and 9 through lead wires 20, 21 and 22, respectively.

In the prior art surface acoustic wave filter described as above, a so-called "penetration" is caused between the input and output by inductive coupling, capacitive coupling and so on through the header 1 and space.

FIG. 3 is a graph showing the frequency characteristics of a ceramic surface acoustic filter of 10.7 MHz constructed as above, in which the ordinate represents the output level in dB and the abscissa represents the frequency in MHz. From the graph of FIG. 3, it will be understood that the penetration level of the filter is high. Due to the high penetration level, the difference between the spurious level or inherent pass band characteristic $a$ of the filter and spurious $b$ at the both sides thereof is lowered.

In order to avoid the above penetration as much as possible, there is considered a surface acoustic wave filter shown in FIGS. 4 and 5. With this filter, the earth pattern 7 of the header 1, which is considered as one cause of the inductive and capacitive couplings between the input and output of the filter, is removed and conductive patterns 22', 23, 24, 12, 13 and 11 are provided around only the terminal pins 8, 9, 10, 15, 16 and 14. With the filter of FIGS. 4 and 5, as may be apparent from its frequency characteristics shown in the graph of FIG. 6, the penetration of the filter is improved by several dB, but the characteristics become unstable. This reason may be considered that no shield is carried out on the back surface of the filter element since the earth pattern is removed.

OBJECTS AND SUMMARY OF THE INVENTION

An object of the present invention is to provide an improved surface acoustic wave apparatus.

Another object of the invention is to provide a surface acoustic wave apparatus in which a penetration level, especially at a high band is improved and hence spurious level is improved.

According to an aspect of the present invention, there is provided a surface acoustic wave apparatus which comprises a surface acoustic wave element, a header on which the surface acoustic wave element is mounted, a conductive earth pattern formed on almost all the upper surface of the header, and input and output earth pins, the earth pattern being separated between the input and output earth pins.

The other objects, features and advantages of the present invention will become apparent from the following description taken in conjunction with the accompanying drawings.

DESCRIPTION OF THE PREFERRED EMBODIMENTS

Figure 1:
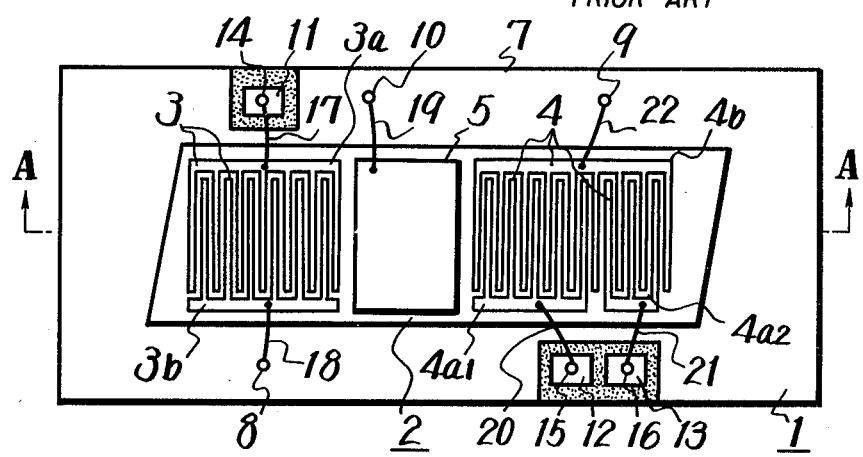
FIG. 1 is a top plan view showing an example of the prior art surface acoustic wave filter.
Figure 2:
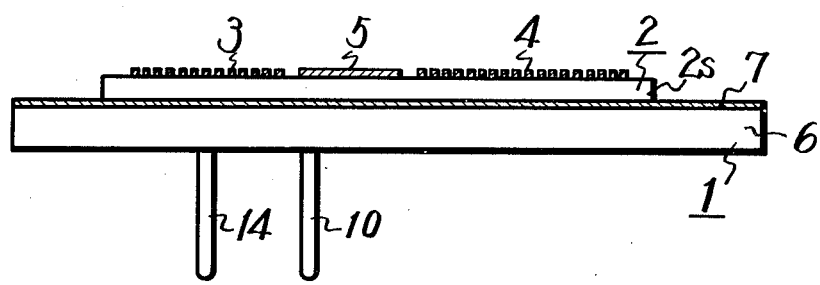
FIG. 2 is a cross-sectional view taken along the line A—A in FIG. 1.

An embodiment of the surface acoustic wave apparatus according to the present invention will be hereinbelow described with reference to FIGS. 7 and 8 in which the elements corresponding to those of FIGS. 1 and 2 will be marked with the same reference numerals and their descriptions will be omitted for the sake of brevity.

According to the invention, on all the upper surface of the header 1 on which the surface acoustic wave element 2 is mounted, there is formed the earth pattern 7 which is made of a conductive layer. In this case, the earth pattern 7 is partially removed along its center portion to form a cut-out portion $7_a$ of a band-shape pattern to lie between the input and output sides of the surface acoustic wave element 2. Thus, the earth pattern 7 is separated between the input side pin 8 and the output side pin 9, and hence is divided into two portions 7A and 7B.

The terminal pin 8, which is connected to the earth electrode $3_b$ of the input electrode 3 through the lead wire 18, and the terminal pin 10, which is connected to the earth electrode 5 through the lead wire 19, are contacted with the portion 7A of the earth pattern 7. A cut-out or removed portion $27_a$ is formed in the portion 7A around the terminal pin 14 which is connected to the input electrode $3_a$ through the lead wire 17, and the conductive pattern 11 is provided on the insulating plate 6 within the cut-out portion $27_a$. This conductive pattern 11 is electrically connected to the pin 14.

While the earth pin 9, which is connected to the earth electrode $4_b$ of the output electrode 4 through the lead wire 22, is contacted with the portion 7B of the earth pattern 7. A cut-out or removed portion $27_b$ is formed in the portion 7B around the terminal pins 15 and 16 which are connected to the output electrodes $4_{a1}$ and $4_{a2}$ of the output electrode 4 through the lead wires 20 and 21, respectively, and the conductive patterns 12 and 13, which are contacted with the terminal pins 15 and 16, respectively, are provided on the insulating plate 6 within the cut-out portion $27_b$.

On the upper surface of the header 1 which is made of, for example, epoxy resin there is coated, for example, a copper foil and then this copper foil is photo-etched to form predetermined patterns, namely portions 7A, 7B, 11, 12 and 13 of the earth pattern 7 at the same time.

Figure 9:
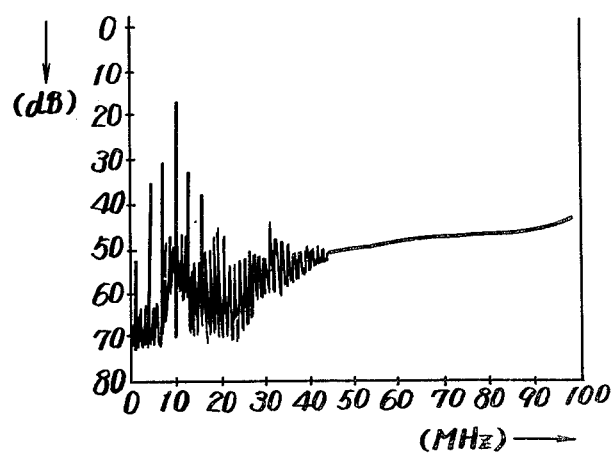
FIG. 9 is a graph showing the frequency characteristics of the surface acoustic wave apparatus shown in FIGS. 7 and 8.

The frequency characteristics of the ceramic surface acoustic wave filter or apparatus of the invention described above of, for example, 10.7 MHz are shown in the graph of FIG. 9, in which the ordinate represents the output level of the filter in dB and the abscissa represents the frequency in MHz. From the graph of FIG. 9, it will be apparent that the penetration is decreased. Thus, the spurious level of the filter of the invention is improved and its characteristics become stable also.

Figure 7:
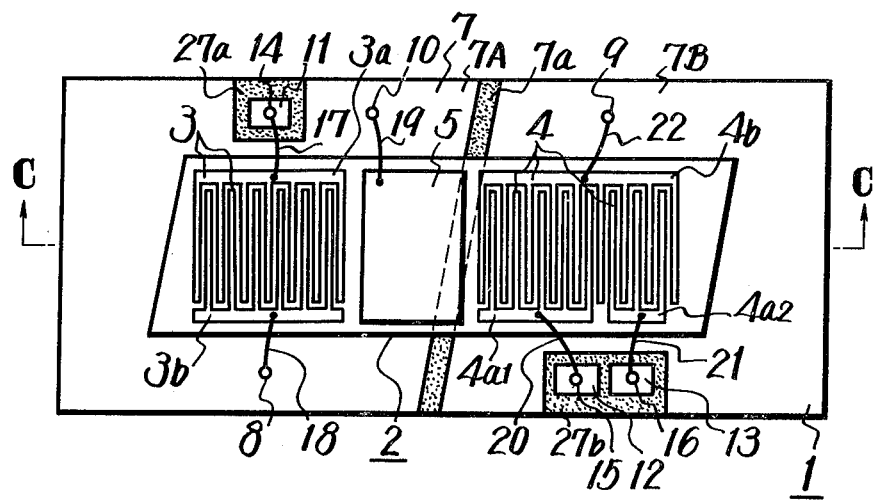
FIG. 7 is a top plan view showing an example of the surface acoustic wave apparatus according to the present invention.
Figure 8:
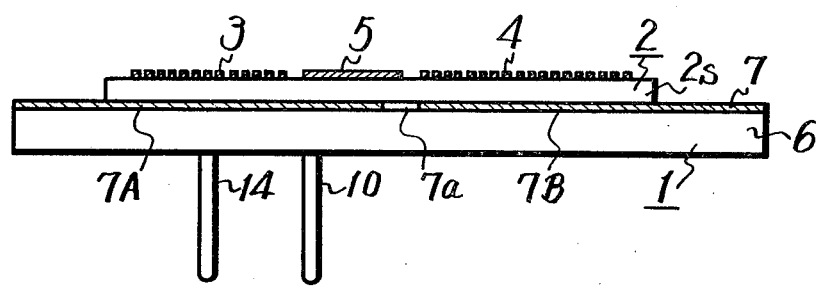
FIG. 8 is a cross-sectional view taken along the line C—C in FIG. 7.
Figure 10:
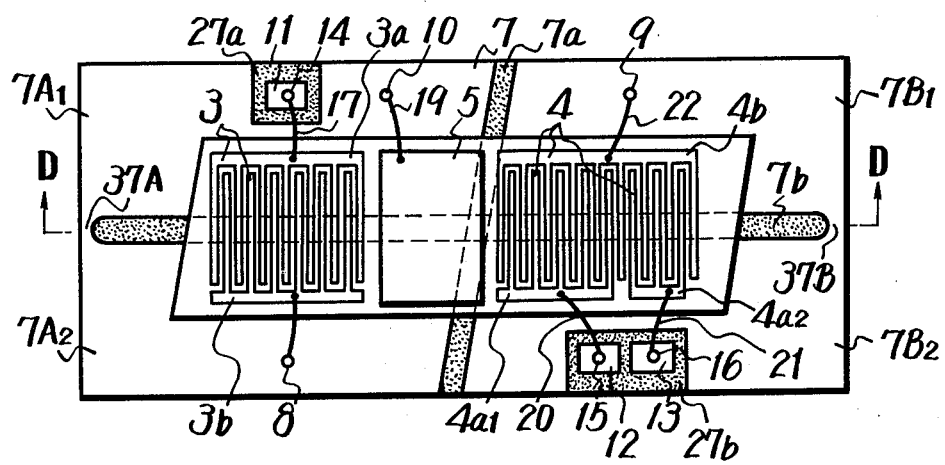
FIG. 10 is a top plan view of another example of the surface acoustic wave apparatus of the invention.
Figure 11:
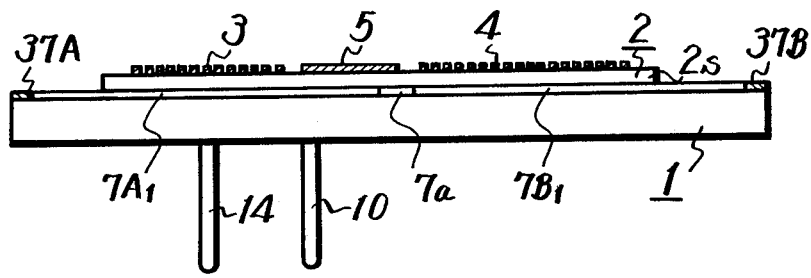
FIG. 11 is a cross-sectional view taken along the line D—D in FIG. 10.

Another example of the invention will be now described with reference to FIGS. 10 and 11 in which the parts corresponding to those of FIGS. 7 and 8 are marked with the same reference numerals and their detailed description will be omitted for the sake of simplicity. In the example of FIGS. 10 and 11, in addition to the cut-out portion $7_a$, another cut-out or removed portion $7_b$ of a band-shape is provided in the earth pattern 7 in the direction intersecting the cut-out portion $7_a$ at approximately right angles which direction is along the surface acoustic wave propagation direction at the center of the earth pattern 7. Thus, the earth pattern 7 is divided into four portions $7A_1$, $7A_2$, $7B_1$ and $7B_2$. At the outside end (left end in the figures) of the cut-out portion $7_b$, there is provided a coupling portion 37A for coupling the portions $7A_1$ and $7A_2$ of the earth pattern 7 at that end so as to obtain an earth current which will be suited for the acoustic filter element on the header 1, while at the outside end (right end in the figures) of the cut-out portion $7_b$, there is provided a coupling portion 37B which couples the portions $7B_1$ and $7B_2$ of the earth pattern 7 at that end so as to connect the portion $7B_2$ to the earth through the earth pin 9. In the example of the invention described with reference to FIGS. 10 and 11, the portions $7A_1$ and $7A_2$ are electrically connected by the coupling portions 37A at the left end of the cut-out portion $7_b$ and those $7B_1$ and $7B_2$ are electrically connected by the coupling portion 37B at the right end of the cut-out portion $7_b$. However, it is possible that the portions $7A_1$ and $7A_2$ and the portions $7B_1$ and $7B_2$ are electrically connected by other members such as lead wires or the like at desired positions, respectively.

Figure 3:
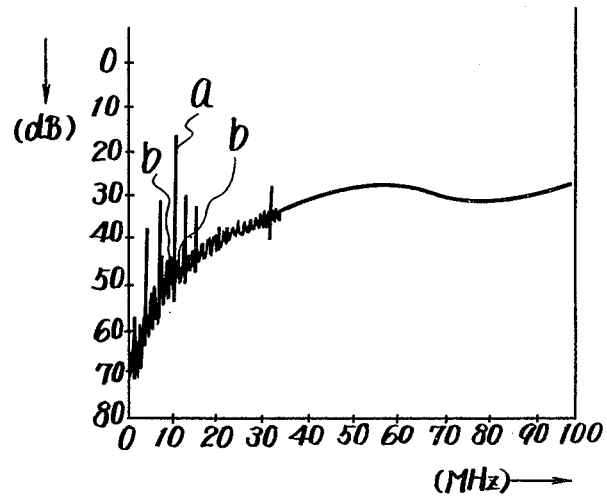
FIG. 3 is a graph showing the frequency characteristics of the surface acoustic wave filter shown in FIGS. 1 and 2.
Figure 4:
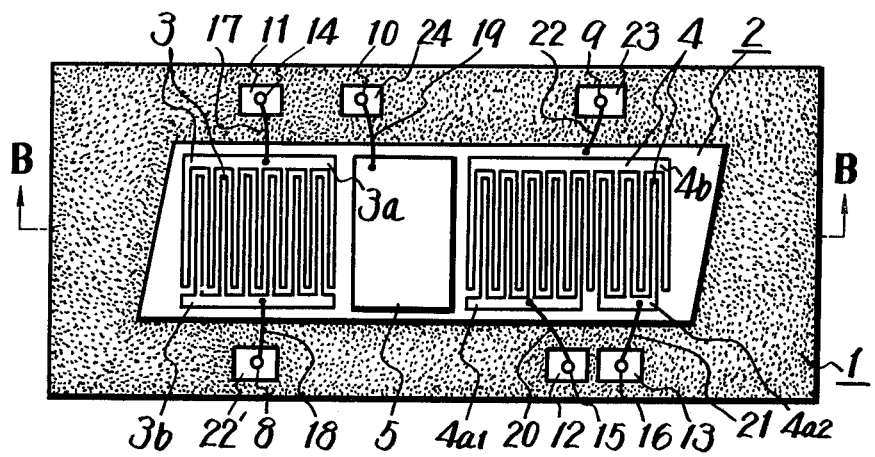
FIG. 4 is a top plan view of a surface acoustic wave filter used for explaining the invention.
Figure 5:
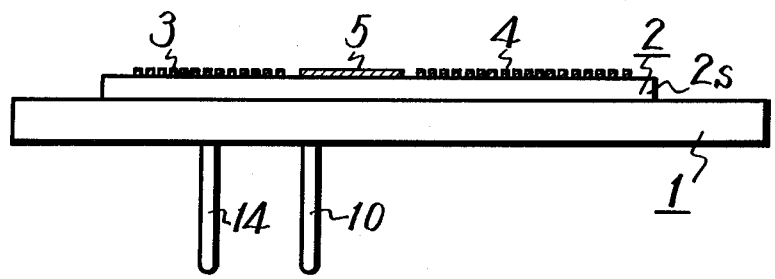
FIG. 5 is a cross-sectional view taken along the line B—B in FIG. 4.
Figure 6:
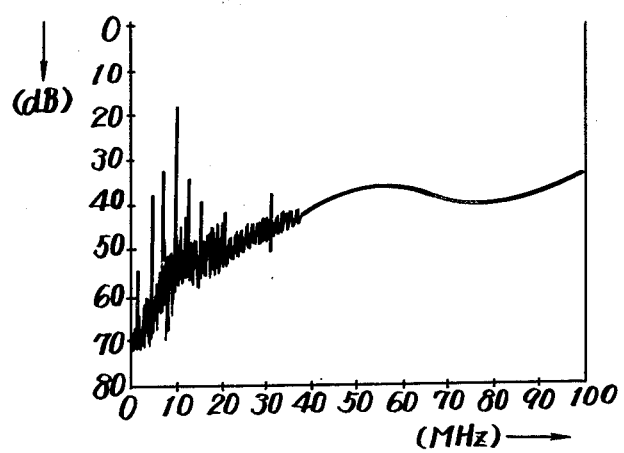
FIG. 6 is a graph of the frequency characteristics of the surface acoustic wave filter shown in FIGS. 4 and 5.
Figure 12:
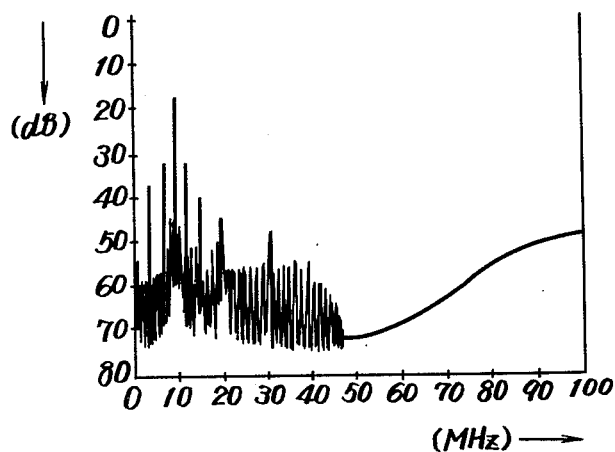
FIG. 12 is a graph of the frequency characteristics of the example shown in FIGS. 10 and 11.

The frequency characteristics of the surface acoustic filter of 10.7 MHz, which is constructed as above, are shown in the graph of FIG. 12. From the comparison of the graphs of FIGS. 3 and 12, it will be apparent that with the filter of the present invention the penetration level is improved by more than 20 dB at the vicinity of 20.7 MHz and 50.0 MHz and by more than 30 dB at the vicinity of 100.0 MHz as compared with the prior art filter.

The frequency characteristics shown in the graphs of FIGS. 3, 6, 9 and 12 are the case where the level is taken as 0 dB when the input and output sides are short-circuited.

As described above, according to the apparatus of the present invention, its penetration level is improved, especially at the high band side, the spurious level, delay characteristic and reproducibility of the inherent pass band of the filter can be enhanced, and hence its design becomes easy and accurate. Further, when it is assembled to a circuit, unstable elements can be avoided by the above advantage of the invention.

It will be apparent that many modifications and variations could be effected by one skilled in the art without departing from the spirit or scope of the novel concepts of the presetn invention, so that the scope of the invention should be determined by the appended claims.

We claim as our invention:
1. A surface acoustic wave apparatus comprising:
 (a) a header made of insulating material;
 (b) an earth pattern made of conductive material and coated on almost all the upper surface of said header;
 (c) a surface acoustic wave element comprising a substrate having a major surface thereof, an input transducer provided on a first portion of said major surface, an output transducer provided on a second portion of said major surface, said surface acoustic wave element being mounted on said header, the surface opposite to said major surface of said substrate being in contact with said earth pattern;
 (d) a first earth pin provided through said header at a side of said first portion of said surface acoustic wave element;

(e) a second earth pin provided through said header at a side of said second portion of said surface acoustic wave element; and (f) a cut-out portion formed through said earth pattern separating said earth pattern between said first and second earth pins.

2. A surface acoustic wave apparatus as claimed in claim 1, wherein said cut-out portion is located to cross substantially the center of said earth pattern between said input and output sides thereof.

3. A surface acoustic wave apparatus according to claim 1, which further comprises a second cut-out portion through said earth pattern located to divide said earth pattern into four portions.

4. A surface acoustic wave apparatus as claimed in claim 3, in which two pairs of said divided portions facing across said second cut-out portion are electrically connected, respectively.

5. A surface acoustic wave apparatus as claimed in claim 4, in which one pair of said divided portions are electrically connected by a coupling portion provided at one end of said second cut-out portion, and the other pair of said divided portions are electrically connected by a coupling portion provided at the other end of said second cut-out portion, respectively.

6. A surface acoustic wave apparatus as claimed in claim 3, in which said second cut-out portion intersects said first mentioned cut-out portion.

7. A surface acoustic wave apparatus as claimed in claim 6, wherein said second cut-out portion intersects said first mentioned cut-out portion in the shape of a cross.

8. A surface acoustic wave apparatus as claimed in claim 6, wherein said second cut-out portion lies in the direction in which a surface acoustic wave propagates.

* * * * *